United States Patent
Skiba et al.

(10) Patent No.: US 10,095,817 B2
(45) Date of Patent: Oct. 9, 2018

(54) DETERMINING WIND LOADING OF STRUCTURES THROUGH WIND FLOW SIMULATION

(71) Applicant: Autodesk, Inc., San Rafael, CA (US)

(72) Inventors: Grzegorz Skiba, Krakow (PL); Leslaw Janus, Skawina (PL); Krzysztof Buchacz, Krakow (PL); Marcin Danielak, Krakow (PL); Brian M. Frank, Lunenburg, MA (US)

(73) Assignee: AUTODESK, INC., San Rafael, CA (US)

( * ) Notice: Subject to any disclaimer, the term of this patent is extended or adjusted under 35 U.S.C. 154(b) by 934 days.

(21) Appl. No.: 14/540,764

(22) Filed: Nov. 13, 2014

(65) Prior Publication Data

US 2016/0140260 A1 May 19, 2016

(51) Int. Cl.
*G06F 17/50* (2006.01)
(52) U.S. Cl.
CPC ................ *G06F 17/5009* (2013.01)
(58) Field of Classification Search
CPC ....................................................... G06F 17/50
USPC ............................................................ 703/1
See application file for complete search history.

(56) References Cited

U.S. PATENT DOCUMENTS

| | | | | |
|---|---|---|---|---|
| 2003/0217514 A1* | 11/2003 | Sherrett | ................... | E06B 3/44 49/445 |
| 2004/0036054 A1* | 2/2004 | Haslim | ................. | C09D 5/024 252/70 |
| 2010/0305916 A1* | 12/2010 | Takahashi | ............... | G01W 1/10 703/2 |
| 2011/0316279 A1* | 12/2011 | Bahari | ...................... | F03D 1/04 290/44 |
| 2013/0110558 A1* | 5/2013 | Maher | .................... | G06Q 40/08 705/4 |
| 2014/0325922 A1* | 11/2014 | Bowers | ................... | E04B 1/985 52/167.2 |
| 2015/0088346 A1* | 3/2015 | Lee | ......................... | B63B 9/001 701/21 |

OTHER PUBLICATIONS

C.W. Letchford, Wind loads on rectangular singboards and hoardings, Jul. 7, 1999.*

* cited by examiner

*Primary Examiner* — Lechi Truong
(74) *Attorney, Agent, or Firm* — Gates & Cooper LLP

(57) ABSTRACT

A method, system, apparatus, article of manufacture, and computer readable storage medium provide the ability to automatically simulate a wind load. An analytical model is converted into a solid model. A wind flow on the solid model is simulated to determine pressures on structural elements of the solid model. The simulating is repeated until the pressures converge. The pressures are converted to loads on the structural elements. Load cases are generated with equivalent loads on the structural elements.

14 Claims, 6 Drawing Sheets

DETERMINING WIND LOADING OF STRUCTURES THROUGH WIND FLOW SIMULATION

BACKGROUND OF THE INVENTION

1. Field of the Invention

The present invention relates generally to structural engineering and design, and in particular, to a method, apparatus, and article of manufacture for determining wind load structure.

2. Description of the Related Art

Engineers must design structures to withstand the loading that the structure will experience. One of the more difficult loadings that the engineer must account for is the effect wind will have when interacting with the structure. Flowing air will create pressure, both positive and negative, when it encounters a structure and interacts with it. Flow patterns are determined by the shape of the structure, and direction that the flowing air comes from. Understanding these interactions and the behavior of the air when interacting with the structure is a complex and time consuming task. Engineers often must rely on expensive and time consuming physical testing for all but the most simple geometries. To better understand the problems of the prior art, a description of wind loads and prior art approaches to determining the effect of wind may be helpful.

When designing structures, structural engineers must account for the effect of different loads/forces that may affect the structure. Different loads/forces cause a structure to move in different ways. For example, gravity loads (e.g., people walking on a structure, furniture in/on a structure, etc.) create a downward load. Loads applied in a sideways orientation (parallel to the ground) may cause a structure to move laterally. Two movements require a structure to have lateral reinforcement: (1) seismic movement (i.e., ground movement); and (2) wind that creates loads causing a building to move laterally. Accordingly, an important consideration for structural engineers is to design a structure with appropriate lateral reinforcement to withstand the effect of wind loads.

Designing a structure to account for different loads is a time consuming aspect of an engineering workflow. Every type of structure is wind exposed. Further, many different load cases have to be considered (as the value and direction of wind may differ). Prior art systems often apply simplified methods to different structure types. In many products, some national codes provide requirements that are used. In other words, load cases are based on building codes promulgated by local jurisdictions. Such prior art methods may be partially automated but are limited to specific structures or geometry types. Further, prior art solutions are very often insufficient for complicated structures. More specifically, for a lot of structure types, the wind load is the most significant load type (e.g., buildings with broad roofs and walls, masts, truss towers, silos, etc.). If the structure consists of a normal shaped building (e.g., rectangular multi-story structure), the code may provide details regarding how to apply load (e.g., based on exposure class and a number of other factors). However, when the geometry is not regular, the engineer must manually determine how the wind will affect a structure (e.g., what happens with flow patterns, where is positive pressure created, where is negative pressure created, etc.). With complicated geometry, determining the different wind load cases can be expensive and difficult.

With complex structures that fall outside of the standard codes, engineers attempt to create various load cases and guestimate as best they can during the building design. This process involves the manual time consuming creation of load cases (e.g., based on many rules, guidelines, and building codes). Thereafter, a model is created. In practice, the load case and model creation may simplify the geometry thereby resulting in overloading or overlooking various aspects. An expensive and time-consuming wind tunnel study is then conducted. In this regard, a physical prototype may be constructed, access to a wind tunnel is required and needs to be paid for, results are analyzed, results are correlated with the design, and the analysis is then scaled in order to determine the loads that are applied to the structure. Accordingly, limitations of a real wind tunnel testing includes not only high costs but also a time consuming process. Further, in many cases, understanding wind loads effects is significant even in the early stage of design, and can drive design stages. Unfortunately, wind tunnel testing often occurs at the later stages of the design process.

In view of the above, prior art systems for determining and analyzing wind loads are time consuming, expensive, and prone to error based on the extensive manual calculations and analysis that are performed. Prior art systems fail to provide any automation, fail to provide flow analysis, and fail to use computational fluid dynamics in order to understand the effects of wind on a structure.

SUMMARY OF THE INVENTION

Embodiments of the invention overcome the problems of the prior art by creating a virtual wind tunnel that may be used to provide an engineer guidance on how a structure will impact flow of the wind and create the conditions around the building as well as how the wind itself will impact the structure. Accordingly, wind simulation may be used for various model types including buildings, bridges, tresses, stadiums, and steel structures (e.g., supporting platforms, towers, etc.). Using computational fluid dynamics, pressures exhibited on a structure may be automatically and quickly predicted. Such pressures are automatically converted to load cases that may be used in the analysis of the structure itself.

Accordingly, embodiments of the invention may be used to validate manual load generations, automatically generate wind loads, provide early feedback during the design process, and may be used for any model type. Further, such wind load generation and analysis is automatic and fast.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
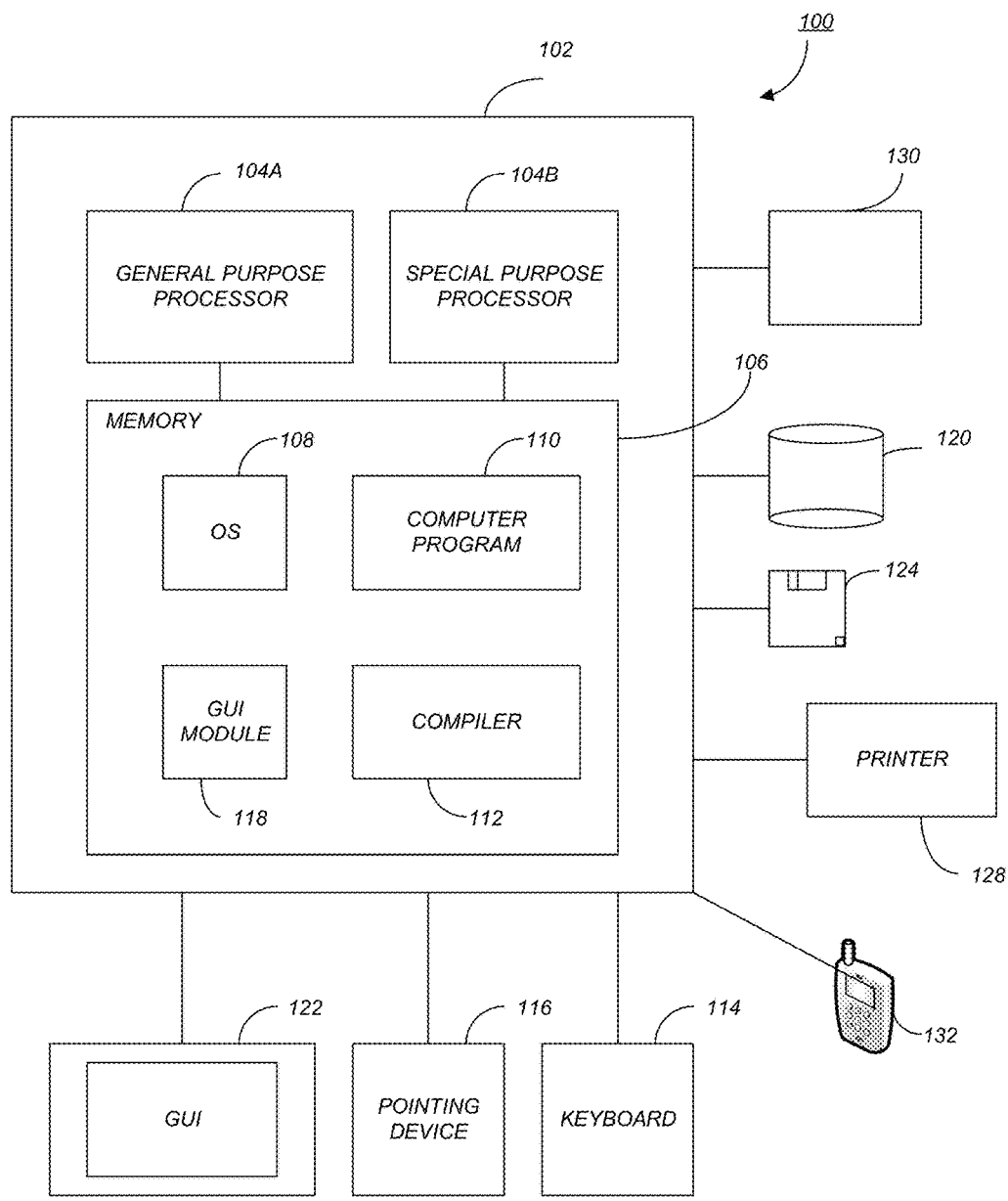
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
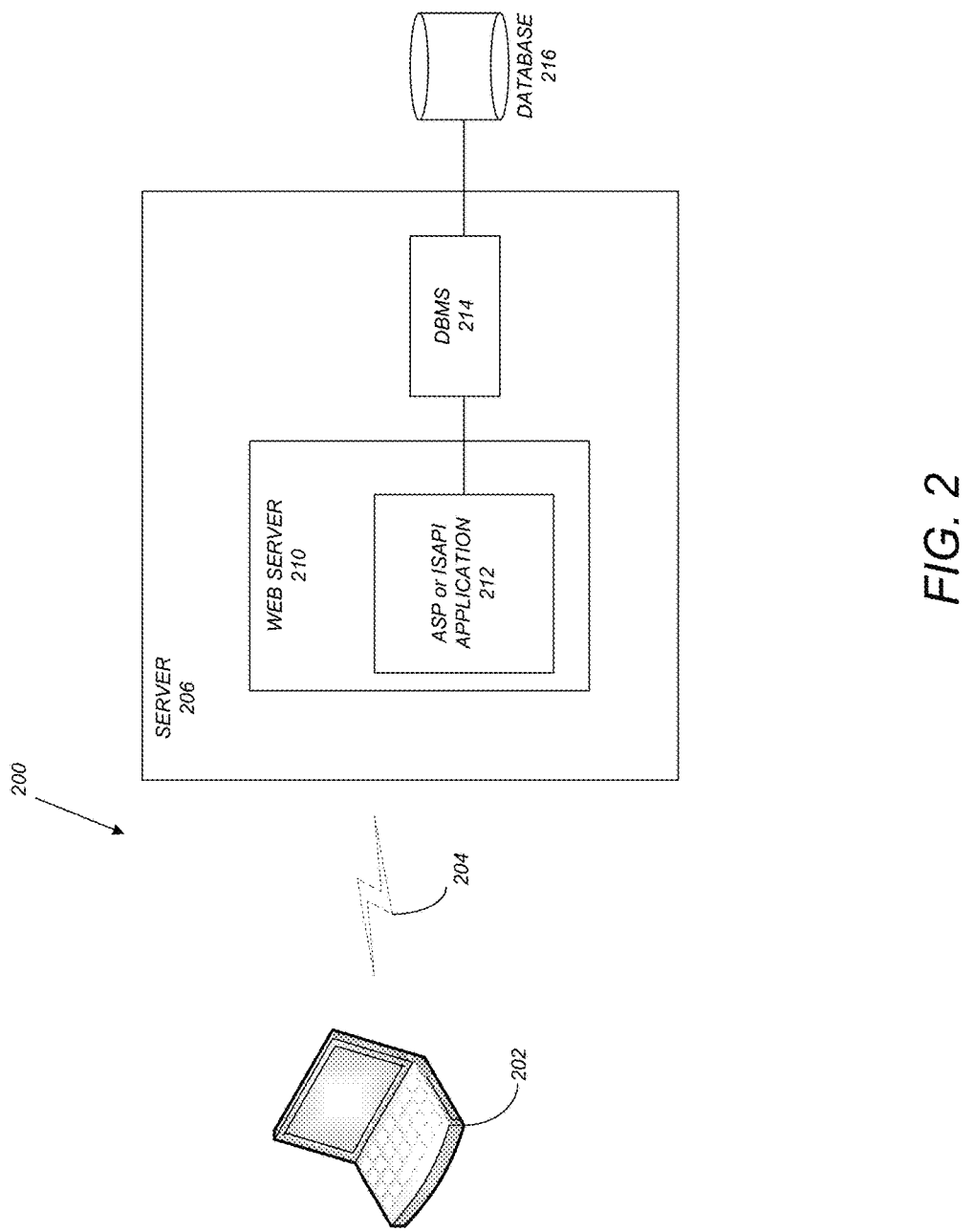
FIG. 2 schematically illustrates a typical distributed computer system using a network to connect client computers to server computers in accordance with one or more embodiments of the invention.

FIG. 2 schematically illustrates a typical distributed computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiment Overview

Embodiments of the invention are implemented as a software application (such as a wind load simulation application) on a client 202 or server computer 206. Further, as described above, the client 202 or server computer 206 may comprise a thin client device or a portable device that has a multi-touch-based display.

Embodiments of the invention provide a method to generate wind loads on any type of structure. The method is based on a simulation of the wind flow using computational fluid dynamics. Wind loads are created automatically based on pressures generated on elements during a simulation process. In particular, elements of the invention include:

a computation fluid dynamics engine used to simulate a wind flow;

automatic simulation parameters set according to a structure size (resolution, bounding box);

conversion of a structural model to a solid model used in a simulation process;

applying wind parameters to a structure and simulation (wind speed, elements, selection, wind profile, wind directions, etc.);

a method to check a convergence process during the simulation;

automatic pressure transfer from the solid model to structural elements (wall, columns, etc.);

automatic loads generation based on the convergence factor; and automatic generation of load cases for different wind directions.

As used herein, the term "automatic" and "automated" provide for performing the action without further/additional user input.

Wind Load Simulation Logical Flow

Automatic wind loads/load cases generation is a completely new approach to defining wind loads. Relying on a simulation engine that allows the modeling of wind flow, it is possible to build a tool that is independent from a code (e.g., building code) based approach. As described above, for complicated structures, with advanced geometry, it's often very tough to calculate wind loads. Wind loads generation, based on wind simulation gives a user the possibility to use software as a substitute for use of a physical wind tunnel. Results from an automatic wind generation may be used to conduct further analysis or as a double-check of a typical (based on codes) approach.

Embodiments of the invention utilize a solver (also referred to herein as a simulation engine) inside a structural analysis application (e.g., Robot Structural Analysis (RSA) Professional™ available from the assignee of the present application). Rather than merely observing wind flow, embodiments of the invention generate wind loads on structure elements based on the wind flow. Further, a solver may be utilized with predefined settings that are optimally set, taking into account speed calculations (performance) and result accuracy. In addition, the structural analysis application may be linked with computational fluid dynamics (CFD) to provide an advanced analysis tool for fluid analysis. Further, a structural analysis model/process may be saved in an appropriate format while flow analysis may be performed in/by a CFD engine/tool.

Figure 3:
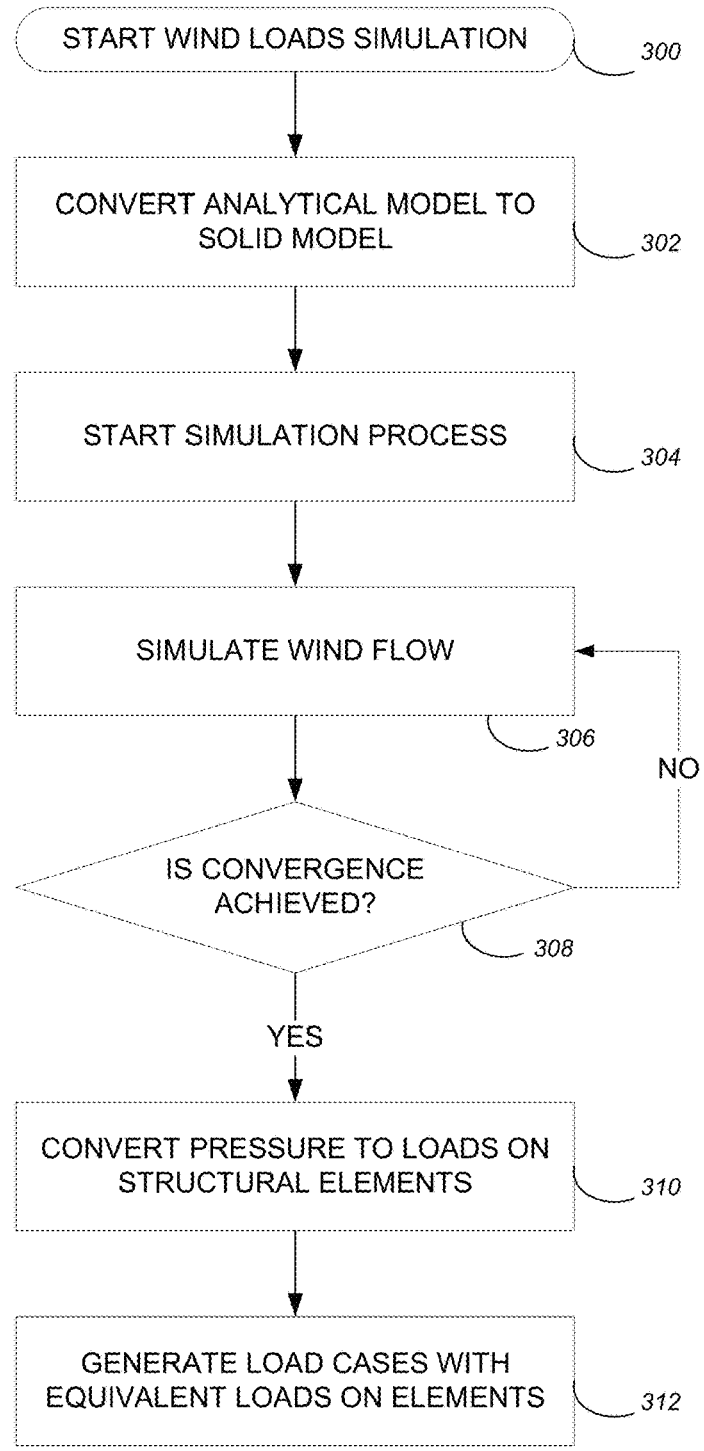
FIG. 3 is a flow chart illustrating the logical flow for automatically simulating wind loads in accordance with one or more embodiments of the invention.

FIG. 3 is a flow chart illustrating the logical flow for automatically simulating wind loads in accordance with one or more embodiments of the invention.

At step 300, the wind load simulation process starts.

At step 302, the analytical model containing the structure is converted to a solid model. Typically, analytical models are merely 2D structures and/or are not solid models in terms of geometry. In contrast, embodiments of the invention convert a structure to a solid model consisting of 3D volumes/elements. This step includes the creation of a geometric representation of a structural system within a structural analysis application. The geometric representation is referred to as an analytical model. The analytical model represents various elements such as beams, columns, floor plates, cladding elements, etc. of a building that perform structural work/support for the building. The analytical model is then converted to the solid model.

Properties/parameters that may influence how the elements behave (e.g., shape, grade of steel, etc.) may also be assigned to the various elements of the solid model. Such parameters may identify whether/where/which openings (in the structure/model) are treated as open (e.g., an open window) and/or closed (a window that is closed/sealed with glazing). Determining whether an element is to be treated as open or closed determines whether to include such elements in the structural/wind flow analysis/simulation and determines whether there is interior wind flow/pressures that need to be analyzed. As an example, wind may flow through a structure that is open (e.g., a parking structure) (thereby creating interior wind flow and pressures) while wind flow may flow around a closed structure (e.g., a residential tower that has windows and doors and no internal wind flow).

In addition to the above, flow may be influenced by a terrain and surrounding structures. As used herein, "terrain" refers to the natural state of the land, while man made objects that might influence the flow falls outside of such terrain. For example, a funneling or channeling effect of window flow may result in a cityscape (e.g., wind in an alley or due to tall buildings). In this regard, structures may direct wind in different directions and the effects may be amplified based on the terrain/structures. To account for such an effect, embodiments of the invention provide for the automatic generation of terrain and/or structure(s) (that allow a user to simulate a real surrounding of a structure). There are two methods for this option. A first method is a free modeler that allows the simulation of surrounding buildings/structures. Such a method may be a random terrain/structure generation method where an object/geometry/structure/terrain is created that mimics the effect that one would find at a physical site. Alternatively, a second method automatically reads an area (buildings/structures/terrain) from maps. In other words, actual data from a physical location/site may be used to provide such terrain/structures. For example, data/information from a 3D mapping application (e.g., Google Earth™) may be leveraged to create the terrain/structures. More specifically, the map data from the actual location where a building under design is to be placed may be utilized to acquire surrounding data that may affect/impact wind flow.

Further to the above, embodiments of the invention may provide for the automatic generation of a façade for a structure. As a structural engineer, the structure/structural system is often modeled without regard to the exterior of the structure. However, as described herein, the exterior (also referred to as the exterior skin) of a structure is what affects wind flow. Accordingly, embodiments of the invention automatically enclose (or add an exterior skin) to a structure based on the frame of the structure rather than manually modeling the exterior. Such an automated façade generation assists the engineer by adding and attaching exterior panels to a structure's foundation/structural elements so that wind simulation may be performed. Further, such a method allows a user to quickly generate non-structural elements that transfer wind loads to a structural frame.

A further enhancement may include the automatic generation of icing (e.g., the automatic change of an element's volume). In an industrial structure with open lattice such as a transmission tower (e.g., built out of steel girders), ice may build upon the elements thereby increasing their volume (i.e., the area of the structure that catches the wind). Embodiments of the invention provide an automated mechanism for increasing the area based on ice build-up. Such a mechanism may increase the geometry of the structure based on an icing condition.

At some point, engineers need to determine the wind load on a structure. In this regard, the engineer takes the analytical model they have developed and creates a scenario where a virtual wind tunnel is used to understand the effects of wind on the structure.

At step 304, the simulation process starts.

At step 306, wind flow is simulated. Such a wind flow simulation may include establishing a virtual bounding box around the designed structure. Based on the size of the structure, such a bounding box may be determined programmatically. To perform the wind flow simulation, the analytical model along with parameters that describe the flow of the wind (e.g., wind speed and direction) are passed onto the solver. The solver interprets the data in terms of how the flow proceeds around/through the structure. Further, the solver determines the pressure that is generated at a particular surface by the impact of the wind. Accordingly, the input to a solver includes the geometry (and flow characteristics) as well as parameters that define the flow of the wind/airstream. Output from the solver include the pressures on the surface of the model. Such simulations are typically run in the cardinal directions (e.g., East, West, North, South) of a structure/project. In this regard, the simulating may be sequentially performed in multiple cardinal directions. Alternatively, the simulating may be performed simultaneously and in arbitrary (not only cardinal) directions. As described herein, the convergence of each simulating is performed, and therefore, the automation of these multiple tasks is possible.

When configuring the simulation, embodiments of the invention may enable the ability to define different wind factors for different wind directions. In other words, a wind profile may be configured where different parameters may be applied to different directions (e.g., a stronger wind coming out of the West). Such a wind profile may also enable the user to define wind speed/direction for different heights. For example, the following wind speeds may be defined: 60 mph for an elevation of 0 feet to 50 feet; 70 mph for an elevation of 50 feet to 100 feet; and 100 mph for elevations over 100 feet. An exemplary graphical user interface for defining such a wind profile is described in further detail below.

An additional enhancement to the wind simulation enables the automated configuration of wind profiles depending on terrain and/or exposure category. In the prior art, an engineer examines a map as part of a building code. Such a wind map provides historical data that determines the wind speed that a structural engineer must design for. However, the exposure class (e.g., near open water, open fields, hilly terrain, dense urban area, etc.) may further affect the wind speed. Embodiments of the invention automatically generate wind profiles for a user based on different codes for different locations as well as the exposure class of the location. The exposure class affects the wind profile by multiplying the wind speed by a factor (e.g., 0.5 due to a coastal area exposure class). To determine the appropriate factor, a lookup table indexed by location may provide a published wind speed and the appropriate factor to utilized based on exposure class. In other words, embodiments of the invention may automatically retrieve a wind speed for a location, determines an appropriate factor, and then automatically adjusts the wind speed by the factor.

The simulated wind flow/pressures may then be presented to the user via a color results map (overlaid onto/integrated with the structure) where different colors represent different pressures on the surface of the structure. Such a color results map may be dynamically updated as the simulation is conducted.

In order to perform an accurate analysis, a point of stability needs to be reached with respect to the pressure generated. In this regard, each time an analysis is performed by the solver, a slightly different result may be output. In particular, even though computational fluid dynamics may be well understood, there is still an amount of chaos in an analysis/results. However, over time and as different particles/elements influence each other, the results from the solver begin to converge.

At step 308, a determination is made regarding whether convergence has been achieved (e.g., if results are no more than 1% different [or within a range set by the user] in terms of a computational fluid dynamics (CFD) analysis). If the results of the wind flow simulation do not converge, the process returns to step 306 for further wind flow simulation. Further details regarding the convergence determination are set forth below.

Once convergence has been achieved, the process proceeds at step 310 where the pressure is converted to loads on the structural elements.

At step 312, load cases are generated with the equivalent loads on the elements. Details regarding the generation of load cases are set forth below. Such a step is performed automatically based on the solver/computational fluid dynamics analysis. Such load cases may be exported/saved to a file/spreadsheet/table that can be accessed by a structural engineer for further analysis/use. Such analysis/use may include displaying a graphical representation of the load cases, actually building/constructing the physical structure/solid model based on the load cases, etc.

Wind Load Simulation Exemplary Graphical User Interface

Several assumptions may be taken into account for simulating wind and generating wind loads:

A user should be able to see a wind flow preview during a simulation process;

Wind loads should be generated automatically (i.e., without additional user input);

A user should be able to generate wind loads at any time during a simulation process;

A system should be able to generate wind loads consecutively for a set of wind directions;

A user should be able to follow a simulation process;

A user should be able to stop a simulation process at any time; and

There should be an automatic pre-selection of elements that are wind exposed.

Wind simulation may be possible in/from a structural analysis application via various methods. In a first method, an internal solver (i.e., within the structural analysis application) may be utilized to generate wind load directly in the application. Using an internal solver, the simulation process may be predefined and a user has limited possibilities to change simulation parameters. In a second method, a model is provided to a CFD application for advanced analysis.

When a user elects to generate wind loads, a dedicated view of a whole structure may be opened with elements that are wind exposed (wind loads carrying) highlighted. In addition, a dedicated dialog comprising initial options and the ability to observe the simulation process and loads generation may be displayed.

Figure 4A:
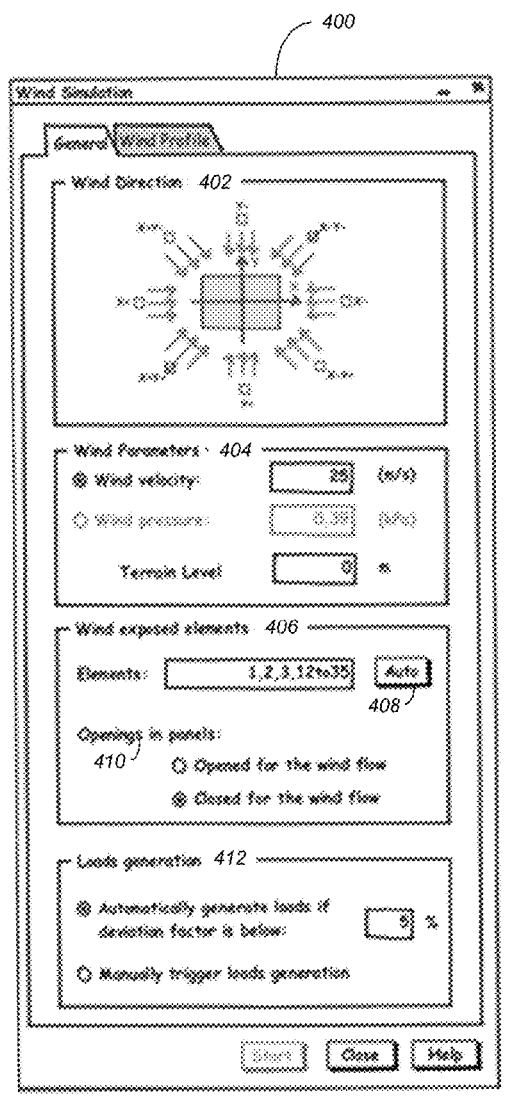
FIGS. 4A and 4B illustrate various window tabs of an exemplary dialog that may be used to set wind simulation parameters in accordance with one or more embodiments of the invention.
Figure 4B:
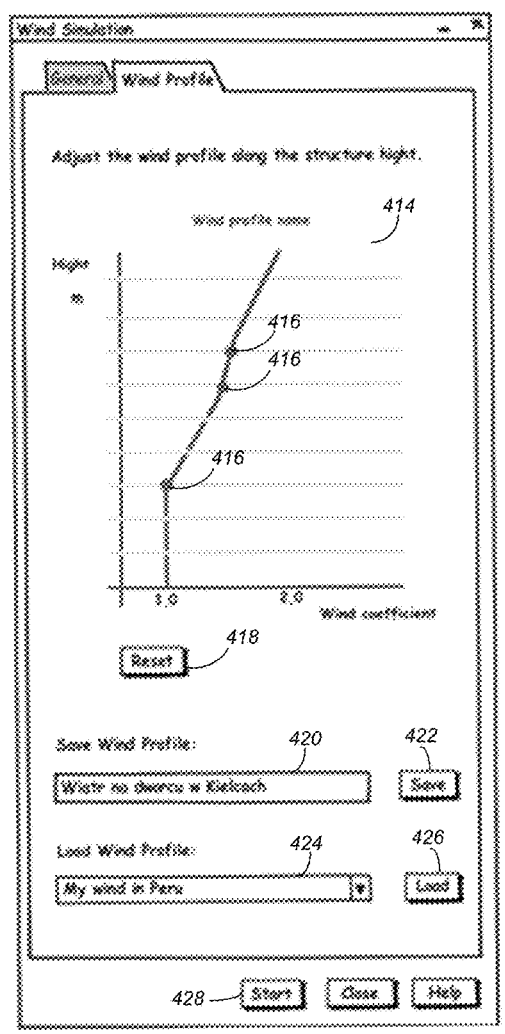

FIGS. 4A and 4B illustrate various window tabs of an exemplary dialog that may be used to set wind simulation parameters in accordance with one or more embodiments of the invention. The dialog 400 may open in a basic form with a left side folded. FIG. 4A illustrates the setup for establishing/defining general parameters. The wind direction 402 (e.g., in a global coordinate system) provides the ability for the user to choose several wind directions (according to main axes and diagonals). If there is more than one direction chosen, a consecutive simulation may start when wind loads are created for a previous direction. As a default, there may always be an x+ direction chosen when the dialog is opened.

Wind parameter area 404 provides the ability to define the wind intensity by wind velocity or wind pressure. The terrain level refers to the 'z' global coordinate and indicates the level zero for a ground around a building/model. A default value may be '0' (zero) according to a global z-coordinate. This setting is a bottom limitation for a virtual bounding box for a wind simulation. In other words, the terrain level creates the bottom bounding plane for the structure to be analyzed. Any part of the structure below the terrain level would not be analyzed/accounted for in the wind analysis as it would be considered a sub-surface structure.

Wind exposed elements area 406 provides the ability to identify a list of elements that are wind loads carrying. The list may be automatically populated and can be edited by the user via a selection of elements in the model (e.g., on a graphical viewer). The "Auto" button 408 enables the user to get back to the list of elements populated automatically (i.e., the default and/or initial pre-selection of elements). The openings in panels field 410 (mainly walls) allows the user to specify whether such panels should be treated as closed or opened for a wind simulation (e.g., with a default of "closed").

Loads generation area 412 provides options for generating loads based on the wind flow. The first option is an automatic procedure based on a convergence metric. This approach is based on a changeability study of resultant forces calculated for different directions for the model. The second option is a manual approach where it is assumed that a user decides when to stop a wind simulation and generate adequate loads. A default value may be the automatic loads generation with a deviation factor of 1%.

FIG. 4B illustrates an exemplary wind profile tab for defining parameters for the wind simulation. As a default, the wind flow intensity may be set as constant along a structure's height. A user can however change a wind velocity/pressure by defining a multiplier to a basis value. The multiplier (wind coefficient) is set on a graph 414 by dragging appropriate points (e.g., points 416). Points are located on parallel lines. Values on the abscissa (horizontal line) may be 1, 2, 3, 4, while values on the ordinate (vertical line) may be 10, 15, 20, 25, 30, 35, 40, 45, 50. The reset button 418 is to get back to a constant value of the wind flow (a multiplier/wind coefficient is set as "1" along the structure's height). To save a wind profile defined on the graph, a name can be inputted in the text field 420 and the save button 422 clicked. Thereafter, a saved wind profile may be loaded using combobox 424 and the load button 426. The name of the current wind profile may be displayed above the graph 414.

Figure 5:
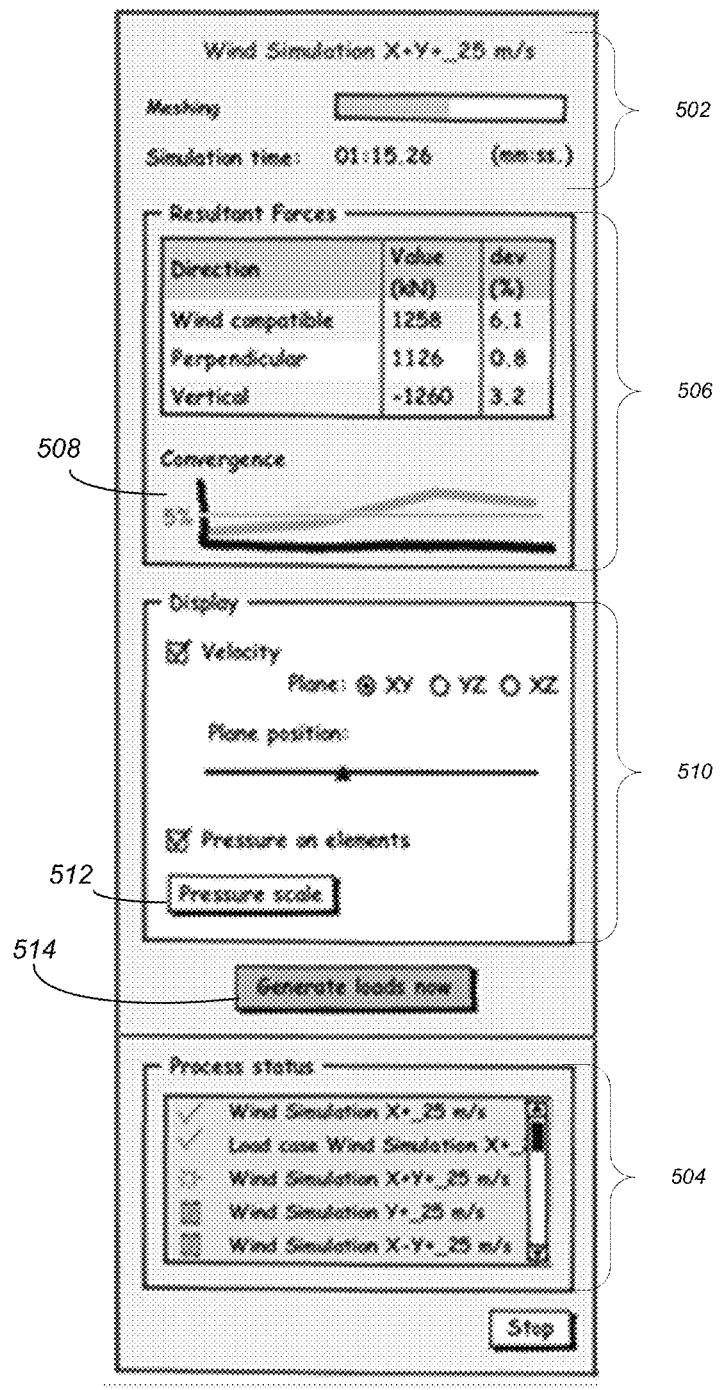
FIG. 5 illustrates a wind simulation progress monitor in accordance with one or more embodiments of the invention.

Once parameters have been established, the wind simulation process may start (i.e., step 304 of FIG. 3) (e.g., via clicking the start button 428). Once the simulation begins, a monitor part of the wind simulation dialog may unfold. The wind simulation progress monitor is illustrated in FIG. 5. There are two areas with general information about the simulation and loads generation progress. The top part 502 and bottom part 504 of the dialog are used for these purposes.

The name of the current wind simulation is located at the top of the window. The name may be predefined and contains a fixed text "Wind Simulation" and the rest depending on a direction and a wind velocity/pressure:

Wind Simulation{direction}_{velocity/pressure value}

The same name may be automatically set as a name of an adequate load case created in the program.

The time of a current simulation may also be displayed in second(s).

In the bottom part 504 (i.e., "Process Status"), the steps performed are shown in a listbox. Different icons may reflect "In Progress", "Done", "Waiting", and "Failed".

The resultant forces area 506 display the forces acting on a structure that are calculated during the simulation time for the main three directions:
- according to the wind direction (Wind compatible);
- perpendicular to the wind direction (Perpendicular);
- in vertical direction, according to the global 'Z' coordinate (Vertical);

During a simulation process, each resultant force is calculated in time intervals. By comparison of forces values in following time steps, a deviation factor is calculated. A user may decide a reference value of the deviation factor (changeability of loads generated on elements). The value is set in the main dialog window (a metric) (i.e., in area 412 of FIG. 4A). The value specified in area 412 is set as a reference on the convergence graph 508. All values above the set reference level may be shown in a first color (e.g., red). Values below may be displayed in a second color (e.g., green). It may be assumed that all resultant forces should be below the set reference value to automatically generate loads based on the metric.

The maps display area 510 provides the ability to configure the presentation of the wind simulation flow in the simulation application. Wind simulation flow may be presented by displaying wind velocity and/or displaying pressure generated by wind on structure members. The wind velocity may be presented on three independent planes, according to the global coordinate system. The velocity map may be flat but animated during a simulation process. The scale may be predefined. The pressure may be displayed directly on an element's face. A map scale can be adjusted in a dedicated dialog accessible using the "Pressure scale" button 512.

At any given time, the user may opt to create loads on elements (members) based on the current wind simulation conditions (i.e., by selecting the "Generate loads now" button 514). Depending on the current simulation step and already existing load cases, the generating loads process may be preceded by some warning/info message.

Wind Loads Simulation Convergence

At set forth above in FIG. 3, steps 306 and 308 determine when computed pressures on the surfaces of a model (based on wind simulation provided by a solver) converge. It may be noted that wind simulation is a dynamic process, changing in time. To track the process and its convergence, some metric is required to reflect the process state. This metric should be constructed in such a way that different model sizes (high-rise building vs. single-family house) and different modes of the wind flow exposure (buildings with exterior façade vs. open models like high voltage pole or offshore drilling platform) are supported.

Transient solvers often never provide totally stable results considering all local pressure changes. However, structural engineers really need stable resulting loads on a structure model. Accordingly, instead of a totally stable system, embodiments of the invention examine converge wind simulation results to within a certain range.

Total Forces

The basic idea is to measure resulting total forces convergence in some time period. Three values are monitored:
$Fx_{wind}$ Total force in wind direction;
$Fy_{wind}$ Total force in horizontal direction and perpendicular to wind direction; and
$Fz_{wind}$ Total force in vertical direction.

Scaling Forces

Total forces' values depend on model size. In order to fulfill the metric stability requirement, some relative values need to be calculated. To properly scale resultant forces one may use:

Dynamic pressure $q=\frac{1}{2}\rho v^2$

Surface $Sx_{wind}$ is obtained by projecting all triangles passed to the simulation to a plane perpendicular to the $x_{wind}$ (wind direction) and calculating the area covered by them. Surface $Sy_{wind}$ is obtained by projecting triangles to the plane perpendicular to the $y_{wind}$ direction, and $Sz_{wind}$ is obtained by projecting triangles to the plane perpendicular to the $z_{wind}$ direction and calculating covered areas respectively.

$Sx_{wind}$, $Sy_{wind}$ and $Sz_{wind}$ values are used for scaling corresponding force. This approach allows for the neutralization of disproportions of the model in wind x, y and z directions.

Scaling Forces:

$$Fx_{scaled}=\rho v^2 Sx_{wind}$$

$$Fy_{scaled}=\rho v^2 Sy_{wind}$$

$$Fz_{scaled}=\rho v^2 Sz_{wind}$$

Metric-Assessment of Resultant Forces Stabilization

The history of $Fx_{wind}$, $Fy_{wind}$, $Fz_{wind}$ for N steps (which could be also converted to simulation time) is calculated and stored.

For the given simulation moment, a maximum change of each of these forces is calculated for N previous steps $$\Delta Fx_{wind} = \max(|Fx_{wind} - Fix_{wind}|)$$

$$\Delta Fy_{wind} = \max(|Fy_{wind} + Fiy_{wind}|)$$

$$\Delta Fz_{wind} = \max(|Fz_{wind} - Fiz_{wind}|)$$

(where $Fix_{wind}$, $Fiy_{wind}$, $Fiz_{wind}$ represent stored values of $Fx_{wind}$, $Fy_{wind}$, $Fz_{wind}$ for a given step respectively—For i=1 to N).

These maximum force changes are now scaled by $Fx_{scaled}$, $Fy_{scaled}$, $Fz_{scaled}$ respectively and displayed as a percentage.

$$\Delta Fx_{scaled} = \Delta Fx_{wind} / Fx_{scaled}$$

$$\Delta Fy_{scaled} = \Delta Fy_{wind} / Fy_{scaled}$$

$$\Delta Fz_{scaled} = \Delta Fz_{wind} / Fz_{scaled}$$

The final metric is the maximum of these three scaled values $$\Delta F_{scaled} = \max(\Delta Fx_{scaled}, \Delta Fy_{scaled}, \Delta Fz_{scaled})$$

In order for the metric to be fully valid, at least N steps of the simulation must be performed.

Metric Parameters

There are two parameters used in the above-described metric. As a result of many experiments, values of these parameters may be:

- N=10—Number of steps to store $Fx_{wind}$, $Fy_{wind}$, $Fz_{wind}$ values for
- $\Delta F_{scaled}$=0.5% —stable loads indicator Wind Loads Simulation—Load Case Generation Assumptions As described above, once results from a wind simulation convergence, the output are the pressures on the structural elements (e.g., that may be provided in terms of a pressure map). Thereafter, steps 310-312 provide for converting the pressure/pressure map to loads and generating load cases that may be utilized for further analysis. The generation of loads/load cases based on an actual pressure map is a complex process.

The primary method to generate loads is a direct conversion of pressure on surfaces to loads applied to elements. A secondary method is to generate a uniform load on elements or subparts of elements. This is an approximate method, but its advantage is easy verification and comparison with analytical methods. Embodiments of the invention are not limited to any particular method for converting the pressures to loads on the structural elements.

Various assumptions may be established for generating the uniform loads under the secondary method:

- Loads are generated as uniform loads (both on linear and planar elements) equivalent to an average value of a pressure calculated for a specific element;
- Loads with the same value (intensity) are grouped together to limit load records in the program; and
- Additional linear loads distributed on panels' edges may be generated in case of big pressure differences over a panel's surface.

Linear Loads on Panels' Edges Generation Method.

Figure 6:
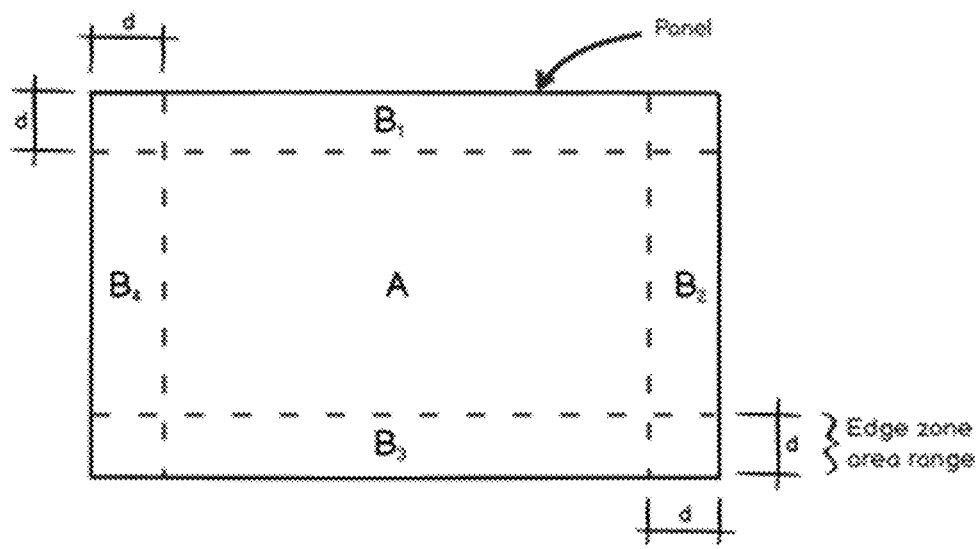
FIG. 6 illustrates the different edges and panels that may be used to compute linear loads in accordance with one or more embodiments of the invention.
Figure 7:
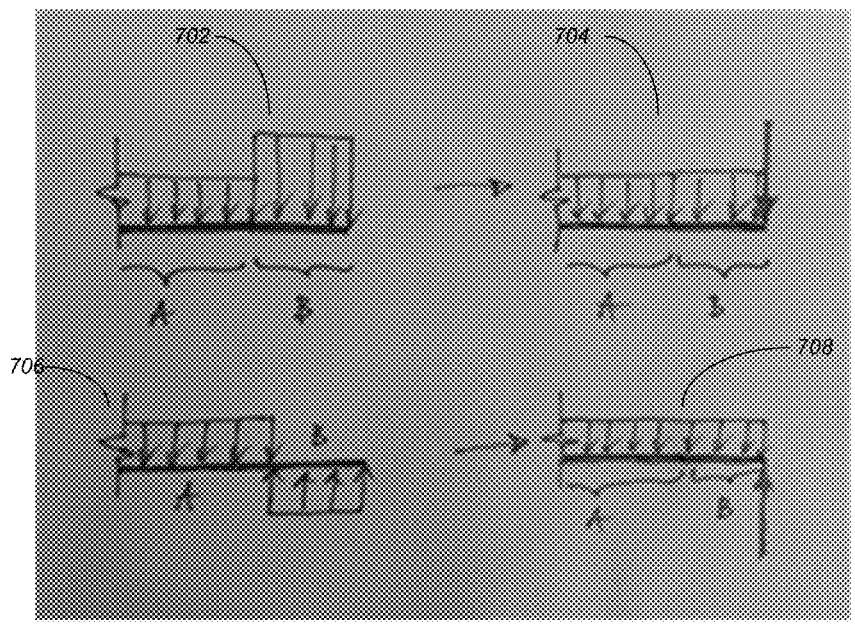
FIG. 7 illustrates the equilibration of a model in accordance with one or more embodiments of the invention.

FIG. 6 illustrates the different edges and panels that may be used to compute linear loads in accordance with one or more embodiments of the invention. In FIG. 6, A represents the main (internal) panel's area, $B_n$ represents the edge area, and d represents the edge zone area range. For each panel (a wall or a slab), a zone d along each edge may be set internally. An average value of pressure is calculated in each area $B_n$. To equilibrate a model, different edge loads may be generated. FIG. 7 illustrates the equilibration of a model in accordance with one or more embodiments of the invention.

If the average pressure value in an edge zone area $B_n$ is sufficiently different than the average pressure value in a main panel's area A, then additional edge loads are generated to counteract such a big difference (e.g., as illustrated at 702 and 704).

The average pressure difference may be calculated as:

$$\Delta P = |P_A - P_{Bn}|$$

where:
- $P_A$—average pressure in the main (internal) area
- $P_{Bn}$—average pressure in the zone area The edge load generation condition may comprise:

$$\Delta P > a \cdot q_{max}$$

where:
- a—scale coefficient
- $q_{max}$—maximum value of the dynamic pressure on a panel $$q_{max} = \tfrac{1}{2} \rho v^2$$

- q—dynamic pressure in pascals
- $\rho$—fluid density in kg/m$^3$
- v—maximum fluid velocity in m/s The constants' values may be:
- scale coefficient: a=0.3
- edge zone area range: d=0.5 [m]

In case of different signs for the pressures in the main A and zone $B_n$ areas (positive vs negative) (e.g., as illustrated at 706), then a scale coefficient may be set to:

$$a = 0.03$$

If the edge loads generation condition is satisfied, then a linear edge load is generated, and the value of the linear load is calculated to equilibrate a model (e.g., as illustrated at 708).

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide for the ability to simulate wind flow using computational fluid dynamics. Further, embodiments of the invention, from within a structural analysis application, automate and present a process for analyzing flow patterns from multiple directions, and generate load cases for analysis. Such an application is flexible, is easy to obtain results for different wind parameters, and is easy to determine preliminary wind effects early in the design process. Further, in case of a change in a structure geometry or structure variants, a user can revise wind load effects quickly. In addition, embodiments of the invention are national code independent and can be perceived as a virtual wind tunnel with automated loads generation that provide significant time and cost savings to the engineer looking to understand the effects of wind and wind loads in structures.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for automatically simulating a wind load, comprising:
   converting, in a computer, an analytical model to a computer solid model by assigning parameters that influence the wind flow to the computer solid model and automatically generating a computer solid modeling façade for the analytical model, wherein:
      the parameters comprise identifying one or more of the elements as open or closed;
      the computer solid modeling façade comprises non-structural elements that transfer the loads to a structural frame; and
      the analytical model comprises a geometric representation of a structural system;
   creating, in the computer, a virtual wind tunnel by simulating a wind flow on the computer solid model to determine pressures on structural elements of the computer solid model;
   repeating, in the computer, the simulating until convergence of the pressures;
   converting, in the computer, the pressures to loads on the structural elements; and
   generating, in the computer, load cases with equivalent load on the structural elements.

2. The computer-implemented method of claim 1, further comprising:
   automatically generating a terrain associated with the computer solid model, wherein the terrain affects the wind flow.

3. The computer-implemented method of claim 1, wherein the converting the analytical to the computer solid model further comprises:
   automatically generating icing by increasing a geometry of the computer solid model based on an icing condition.

4. The computer-implemented method of claim 1, wherein the simulating the wind flow comprises:
   programmatically determining a bounding box around the computer solid model;
   defining wind parameters that describe a flow of the wind; and
   generating, via computational fluid dynamics, based on the bounding box and the wind parameters, the pressures on the structural elements.

5. The computer-implemented method of claim 1, wherein the simulating is sequentially performed in multiple cardinal directions.

6. The computer-implemented method of claim 1, wherein the simulating comprises:
   defining a wind profile comprising different wind factors for different wind directions and/or heights of the computer solid model, wherein the wind profile is used to simulate the wind flow.

7. The computer-implemented method of claim 1, wherein the simulating comprises:
   automatically configuring a wind profile that is dependent on terrain and an exposure category, wherein the wind profile is used to simulate the wind flow.

8. A non-transitory computer readable storage medium encoded with computer program instructions which when accessed by a computer cause the computer to load the program instructions to a memory therein creating a special purpose data structure causing the computer to operate as a specially programmed computer, executing a method of automatically simulating a wind load, comprising:
   converting, in the specially programmed computer, an analytical model to a solid model by assigning parameters that influence the wind flow to the computer solid model and automatically generating a computer solid modeling façade for the analytical model, wherein:
      the parameters comprise identifying one or more of the elements as open or closed;
      the computer solid modeling façade comprises non-structural elements that transfer the loads to a structural frame; and
      the analytical model comprises a geometric representation of a structural system;
   creating a virtual wind tunnel by simulating, in the specially programmed computer, a wind flow on the computer solid model to determine pressures on structural elements of the computer solid model;
   repeating, in the specially programmed computer, the simulating until convergence of the pressures;
   converting, in the specially programmed computer, the pressures to loads on the structural elements; and
   generating, in the specially programmed computer, load cases with equivalent load on the structural elements.

9. The non-transitory computer readable storage medium of claim 8, further comprising:
   automatically generating a terrain associated with the computer solid model, wherein the terrain affects the wind flow.

10. The non-transitory computer readable storage medium of claim 8, wherein the converting the analytical to the computer solid model further comprises:
    automatically generating icing by increasing a geometry of the computer solid model based on an icing condition.

11. The non-transitory computer readable storage medium of claim 8, wherein the simulating the wind flow comprises:
    programmatically determining a bounding box around the computer solid model;
    defining wind parameters that describe a flow of the wind; and
    generating, via computational fluid dynamics, based on the bounding box and the wind parameters, the pressures on the structural elements.

12. The non-transitory computer readable storage medium of claim 8, wherein the simulating is sequentially performed in multiple cardinal directions.

13. The non-transitory computer readable storage medium of claim 8, wherein the simulating comprises:
    defining a wind profile comprising different wind factors for different wind directions and/or heights of the computer solid model, wherein the wind profile is used to simulate the wind flow.

14. The non-transitory computer readable storage medium of claim 8, wherein the simulating comprises:
    automatically configuring a wind profile that is dependent on terrain and an exposure category, wherein the wind profile is used to simulate the wind flow.

* * * * *